(12) United States Patent
Meade

(10) Patent No.: US 10,109,640 B2
(45) Date of Patent: Oct. 23, 2018

(54) TRANSISTORS HAVING DIELECTRIC MATERIAL CONTAINING NON-HYDROGENOUS IONS AND METHODS OF THEIR FABRICATION

(71) Applicant: MICRON TECHNOLOGY, INC., Boise, ID (US)

(72) Inventor: Roy Meade, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/867,089

(22) Filed: Jan. 10, 2018

(65) Prior Publication Data
US 2018/0130815 A1 May 10, 2018

Related U.S. Application Data

(60) Continuation of application No. 15/098,605, filed on Apr. 14, 2016, now Pat. No. 9,881,932, which is a
(Continued)

(51) Int. Cl.
| | | |
|---|---|---|
| *G11C 11/34* | (2006.01) | |
| *H01L 27/11568* | (2017.01) | |
| *H01L 29/423* | (2006.01) | |
| *H01L 21/02* | (2006.01) | |
| *H01L 21/28* | (2006.01) | |
| *H01L 29/792* | (2006.01) | |
| *H01L 29/51* | (2006.01) | |

(Continued)

(52) U.S. Cl.
CPC .. *H01L 27/11568* (2013.01); *H01L 21/02112* (2013.01); *H01L 21/02318* (2013.01); *H01L 21/28176* (2013.01); *H01L 21/326* (2013.01); *H01L 27/115* (2013.01); *H01L 27/11521* (2013.01); *H01L 29/4234* (2013.01); *H01L 29/51* (2013.01); *H01L 29/7883* (2013.01); *H01L 29/792* (2013.01); *H01L 29/78* (2013.01)

(58) Field of Classification Search
CPC .......... H01L 27/11568; H01L 29/4234; H01L 29/51; H01L 29/78; H01L 21/02112; H01L 21/02318; H01L 27/115; H01L 29/7893
USPC ....................... 365/185.03, 185.24
See application file for complete search history.

(56) References Cited

U.S. PATENT DOCUMENTS

| | | |
|---|---|---|
| 3,590,337 A | 6/1971 | Wegener et al. |
| 3,793,090 A | 2/1974 | Barile et al. |

(Continued)

OTHER PUBLICATIONS

Williams et al., "Low Temperature Diffusion of Alkali Earth Cations in Thin, Vitreous SiO2 Films", The Journal of Electrochemical Society, vol. 142, No. 1, Jan. 1995, pp. 303-311.

(Continued)

*Primary Examiner* — Viet Q Nguyen
(74) *Attorney, Agent, or Firm* — Dicke, Billig & Czaja, PLLC

(57) ABSTRACT

Methods for fabricating a transistor include forming a dielectric material adjacent to a semiconductor, introducing non-hydrogenous ions into the dielectric material, and forming a control gate adjacent to the dielectric material. Transistors include source/drain regions in a semiconductor, a dielectric material adjacent to the semiconductor and containing non-hydrogenous ions, and a control gate adjacent to the dielectric material.

20 Claims, 2 Drawing Sheets

Related U.S. Application Data division of application No. 14/588,659, filed on Jan. 2, 2015, now Pat. No. 9,318,321, which is a division of application No. 12/829,629, filed on Jul. 2, 2010, now Pat. No. 8,941,171.

(51) Int. Cl.
*H01L 27/115* (2017.01)
*H01L 27/11521* (2017.01)
*H01L 21/326* (2006.01)
*H01L 29/788* (2006.01)
*H01L 29/78* (2006.01)

(56) References Cited

U.S. PATENT DOCUMENTS

| | | | |
|---|---|---|---|
| 4,090,253 A | 5/1978 | Salgo | |
| 5,187,379 A * | 2/1993 | Noda | H01L 29/1075 257/192 |
| 5,260,593 A | 11/1993 | Lee | |
| 5,559,351 A | 9/1996 | Takiyama | |
| 5,591,994 A * | 1/1997 | Hara | H01L 29/0891 257/192 |
| 5,616,947 A * | 4/1997 | Tamura | H01L 21/28264 257/289 |
| 5,830,575 A | 11/1998 | Warren et al. | |
| 6,140,157 A | 10/2000 | Warren et al. | |
| 6,159,829 A | 12/2000 | Warren et al. | |
| 6,566,281 B1 | 5/2003 | Buchanan et al. | |
| 7,113,431 B1 | 9/2006 | Hamilton et al. | |
| 7,242,049 B2 | 7/2007 | Forbes et al. | |
| 7,277,314 B2 | 10/2007 | Busta | |
| 8,941,171 B2 * | 1/2015 | Meade | H01L 29/4234 257/324 |
| 9,318,321 B2 * | 4/2016 | Meade | H01L 21/02112 |
| 9,881,932 B2 * | 1/2018 | Meade | H01L 27/11568 |
| 2004/0004251 A1 | 1/2004 | Madurawe | |
| 2004/0147137 A1 | 7/2004 | Hiraiwa et al. | |
| 2005/0167734 A1 | 8/2005 | She et al. | |
| 2005/0232051 A1 | 10/2005 | Pan et al. | |
| 2005/0238889 A1 | 10/2005 | Iwamoto et al. | |
| 2005/0276143 A1 | 12/2005 | Busta | |
| 2006/0022252 A1 | 2/2006 | Doh et al. | |
| 2006/0113586 A1 | 6/2006 | Wang | |
| 2006/0198216 A1 | 9/2006 | Park et al. | |
| 2006/0284082 A1 | 12/2006 | Furnemont | |
| 2007/0042547 A1 | 2/2007 | Kikuchi et al. | |
| 2007/0232041 A1 | 10/2007 | Choi et al. | |
| 2007/0267621 A1 | 11/2007 | Ufert | |
| 2008/0096394 A1 * | 4/2008 | Chen | H01L 21/02126 438/758 |
| 2008/0150003 A1 | 6/2008 | Chen et al. | |
| 2009/0134388 A1 * | 5/2009 | Yamauchi | H01L 21/26506 257/42 |
| 2009/0146202 A1 | 6/2009 | Leong et al. | |
| 2009/0236632 A1 | 9/2009 | Anderson et al. | |
| 2009/0267159 A1 * | 10/2009 | Tstsumura | H01L 21/823828 257/369 |
| 2009/0286333 A1 | 11/2009 | Kozasa et al. | |
| 2010/0109099 A1 * | 5/2010 | Nishi | H01L 21/265 257/412 |
| 2011/0134958 A1 | 7/2011 | Arora et al. | |
| 2011/0182108 A1 | 7/2011 | Williams et al. | |
| 2012/0012919 A1 | 1/2012 | Kan et al. | |
| 2012/0025287 A1 | 2/2012 | Golubovic | |
| 2013/0049119 A1 | 2/2013 | Huang et al. | |

OTHER PUBLICATIONS

Fleetwood et al., "Nonvolatile Memory Based on Mobile Protons", 1998 Int'l NonVolatile Memory Technology Conference, 1998 IEEE, pp. 91-94.

Warren et al., "Protonic Nonvolatile Field Effect Transistor Memories in Si/SiO2/Si Structures", IEEE Transactions on Nuclear Science, vol. 44, No. 6, Dec. 1997, pp. 1789-1793.

Linder et al., "Growth and Scaling of Oxide Conduction after Breakdown", 41st Annual International Reliability Physics Symposium, Dallas, Texas, 2003 IEEE, pp. 402-405.

Stukov et al., "Exponential ionic drift: fast switching and low volatility of thin-film memristors", Applied Physics A: Materials Science and Processing, Nov. 2008, pp. 515-519.

* cited by examiner

TRANSISTORS HAVING DIELECTRIC MATERIAL CONTAINING NON-HYDROGENOUS IONS AND METHODS OF THEIR FABRICATION

RELATED APPLICATIONS

This application is a Continuation of U.S. patent application Ser. No. 15/098,605, titled "METHODS OF ADJUSTING FLATBAND VOLTAGE OF A MEMORY DEVICE," filed on Apr. 14, 2016, and issued as U.S. Pat. No. 9,881,932 on Jan. 30, 2018, which is a Divisional of U.S. patent application Ser. No. 14/588,659, titled "METHODS OF FABRICATING MEMORY DEVICES HAVING CHARGED SPECIES," filed on Jan. 2, 2015, and issued as U.S. Pat. No. 9,318,321 on Apr. 19, 2016, which is a Divisional of U.S. patent application Ser. No. 12/829,629, titled "FLATBAND VOLTAGE ADJUSTMENT IN A SEMICONDUCTOR DEVICE," filed Jul. 2, 2010, and issued as U.S. Pat. No. 8,941,171 on Jan. 27, 2015, which is commonly assigned and incorporated herein by reference in its entirety.

TECHNICAL FIELD

The present embodiments relate generally to adjustment of a flatband voltage in a semiconductor device.

BACKGROUND

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, flash drives, digital cameras, and cellular telephones. Program code and system data such as a basic input/output system (BIOS) are typically stored in flash memory devices for use in personal computer systems.

A flash memory device is a type of memory in which the cells are typically grouped into blocks that can be erased and reprogrammed in blocks instead of one byte at a time. Changes in threshold voltage of the memory cells, through erasing or programming of charge storage structures (e.g., floating gates or charge traps) or other physical phenomena (e.g., phase change or polarization), determine the data value of each cell. The data in a cell of this type is determined by the presence or absence of the charge in the charge storage structure.

A typical flash memory cell comprises a semiconductor on which a dielectric material is formed. The charge storage structure is formed in or adjacent to the dielectric material and a control gate is formed on the dielectric material to control operation of the memory cell. Typical prior art programming uses either Fowler-Nordheim tunneling or hot electron injection to move a charge from a channel in the semiconductor onto the charge storage structure. This type of programming can result in a number of problems.

For example, in order to move the electrons through the dielectric material, a relatively large programming voltage is used (e.g., 20V). Thus, charge pump circuitry is typically used in order to generate the relatively large programming voltages. This circuitry takes up valuable real estate on the integrated circuit. Also, the mechanism by which the electrons tunnel through the tunnel dielectric material damages the dielectric. This limits the number of program/erase cycles that a flash memory device can endure before the dielectric wears out and loses its insulating properties. The memory device then loses its retention capability.

For the reasons stated above, and for other reasons stated below that will become apparent to those skilled in the art upon reading and understanding the present specification, there is a need in the art for a relatively lower voltage memory that can endure a greater number of program/erase cycles.

DETAILED DESCRIPTION

Figure 1:
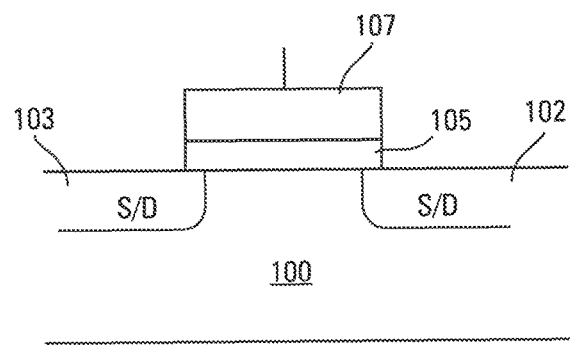
FIG. 1 shows a cross-sectional view of one embodiment of a metal oxide semiconductor field effect transistor.

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

FIG. 1 illustrates a cross-sectional view of one embodiment of a metal oxide semiconductor field effect transistor (MOSFET). MOSFET is a generic term in the art to describe types of transistors that, at least initially, were formed with metal gates. Even though more recent FET's use a polysilicon gate, these transistors are still referred to as MOSFET's in the art.

The transistor comprises a pair of source/drain regions 102, 103 formed in a semiconductor 100 (e.g., a monocrystalline silicon substrate), a dielectric material 105 formed adjacent to (e.g., on and/or over) the semiconductor 100, and a control gate 107 formed adjacent to the dielectric material 105. The illustrated embodiment incorporates a charged species (e.g., mobile ions) in the dielectric material that adjusts the transistor flatband voltage in response to a voltage on the control gate.

While the present disclosure refers to MOSFET's, the flatband voltage adjustment created by mobile ions in the dielectric material can be used in any MOS semiconductor device. For example, a MOS capacitor might be one such embodiment.

A MOSFET cell that incorporates the mobile ions for flatband voltage adjustment can be used as non-volatile memory cells, as disclosed subsequently. The flatband voltage adjustment can also be used in MOSFET's that are not intended to be used as memory devices. For example, a circuit designer could change the threshold voltage of a transistor to fit a particular design by biasing the transistor control gate with a certain voltage.

The semiconductor 100, in one embodiment, is silicon. Alternate embodiments might use other types of semiconductor materials such as germanium. The source/drain regions 102, 103 can be formed in the semiconductor 100 by doping the semiconductor 100, e.g., by implantation or diffusion. The area in the semiconductor between the source/drain regions 102, 103 can be considered the channel region since a channel forms between the two source/drain regions 102, 103 during transistor operation.

The dielectric material can be formed on the semiconductor between the source/drain regions 102, 103 and over the channel region of the semiconductor 100. The dielectric material can be, for example, any relatively high dielectric constant (e.g., k≥3.9) insulation material. In one embodiment, the dielectric material is silicon dioxide ($SiO_2$). In one embodiment, the dielectric material can be formed to be less than approximately 70 Å thick (e.g., less than 70 Å thick).

As discussed previously, the dielectric material can be doped with mobile ions (e.g., alkali contamination) to provide the ability to adjust the flatband voltage. One example of an ion that is mobile in $SiO_2$ is calcium. An alternate embodiment might use magnesium. The present disclosure is not limited to just these two ions. Alternate embodiments can use any ions that have an energy barrier (e.g., an activation energy of diffusion) greater than about 0.5 eV to about 3.0 eV. Ions with an energy barrier less than 0.5 eV are believed to be too mobile to posses any useful data retention while ions with an energy barrier greater than 3.0 eV are believed to be too hard to write or erase.

A number of methods can be employed to introduce ions into the dielectric material. Ions can be introduced prior to oxide formation (e.g., growth or deposition), during oxide formation, or after oxide formation. The ions can be introduced prior to or during oxide formation by immersing the wafer containing the future transistor into an alkali solution prior to forming the oxide or allowing contact with alkali material during formation of the oxide. The alkali solution can leave the impurities on the semiconductor surface to be introduced during formation of the dielectric material.

The ions can also be introduced after oxide formation, e.g., by ion implantation. For example, it has been shown that implantation and high temperature activation of calcium distributions in silica MOS capacitor film has indicated a positive flatband voltage shift after device annealing at 1100° C. in a nitrogen atmosphere. Calcium would be present as a negative ion in a high activation energy site.

Ions can also be introduced after oxide formation by contacting the oxide with an alkali solution. Immediately after oxide formation, for example, the wafers might be placed in a basic solution of either $Ca(OH)_2$ or $MgCl_2+Mg(OH)_2$ dissolved in deionized water to introduce calcium or magnesium ions, respectively.

The control gate 107 can be formed on the dielectric material 105. The control gate 107 can be one or more conductive materials, e.g., a polysilicon and/or a metal material. Biasing of the control gate 107 can provide control of the flatband voltage of the transistor by repelling the charged species to being adjacent to the semiconductor 100 or attracting the charged species to being adjacent to the control gate 107.

For example, if the MOSFET is being used as a single level cell (SLC) memory cell, the ions being adjacent to the control gate might be one state while the charge being adjacent to the channel region of the semiconductor might be a different state (e.g., a second state). A MOSFET being used as a multiple level cell (MLC) memory cell might move the charge to one of a plurality of different levels of the dielectric material to represent one of a plurality of different states. The expected changes in the flatband voltage can be illustrated by the following equation:

$$V_{FB} = \phi_{MS} - \frac{Q_f}{C_{ox}} - \gamma \frac{Q_m}{C_{ox}} - \gamma \frac{Q_{ot}}{C_{ox}} - \frac{Q_{it}(\phi_s)}{C_{ox}} \quad (1)$$

In equation (1), $V_{FB}$ is the flatband voltage, $\phi_{MS}$ is the semiconductor work function difference, $C_{ox}$ is the MOS capacitance, $Q_f$ is the fixed oxide charge (located near the semiconductor/dielectric interface), $Q_m$ is the mobile oxide charge, $Q_{ot}$ is the tunnel dielectric trapped charge, $Q_{it}$ is the trapped interface charge and γ is the charge distribution factor. The work function can be defined as the minimum energy (usually measured in electron volts) needed to remove an electron from a solid to a point immediately outside the solid surface.

The effect on the flatband voltage is greatest when then charge is located near the semiconductor/dielectric interface since the charge is then imaged in the semiconductor. When the charge is located at the gate/dielectric interface, the charge is imaged in the gate which has little to no effect on the flatband voltage. If the charge is near the polysilicon gate/tunnel dielectric interface, then γ=0. If the charge is near the semiconductor/dielectric interface, then γ=1. The charge can also be moved to some location between the gate and the semiconductor so that 0<γ<1. Replacing γ in equation (1) above with these values shows how $V_{FB}$ changes as the charge moves within the dielectric material.

In one embodiment, the charged species is a positively charged ion (i.e., cation) so that a negative voltage on the control gate attracts the charge and a positive voltage repels the charge. In another embodiment, the charged species is a negatively charged ion (i.e., anion) so that the opposite is true. In one embodiment, the mobile ion is a non-hydrogenous ion.

For desired operation of a MOSFET to operate as a memory device, the ion should be mobile within the dielectric material without being too mobile. An ion that is not mobile enough will require a relatively large voltage on the control gate in order to move the charge to program the MOSFET. An ion that is too mobile will move even after the voltage on the control gate is removed, reducing its usefulness as a memory device.

Figure 2:
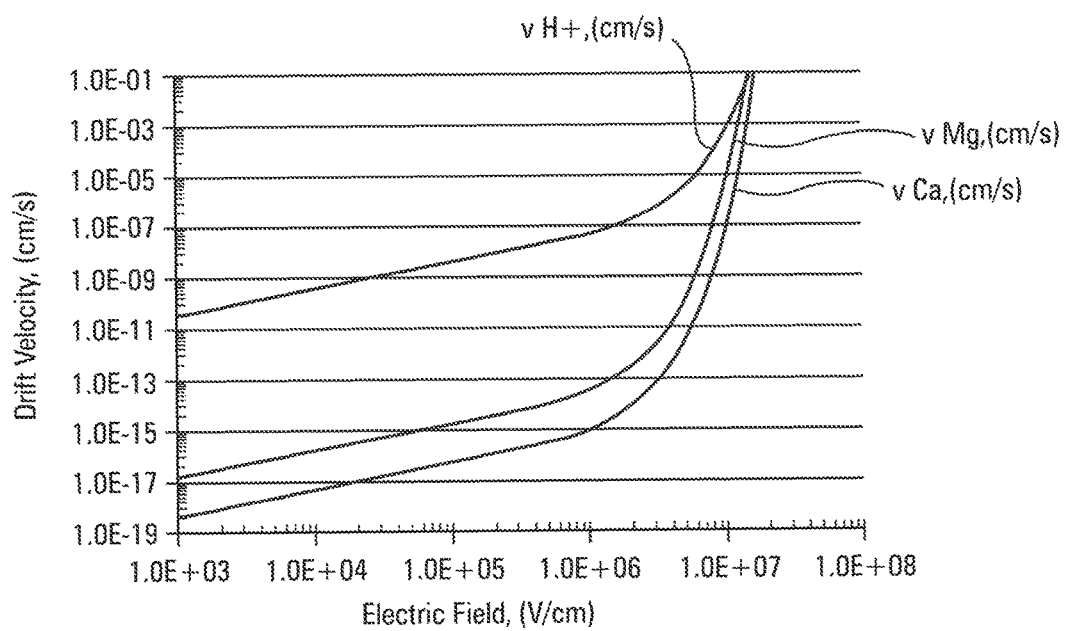
FIG. 2 shows a diagram of one embodiment of expected drift velocity of calcium and magnesium ions compared to hydrogen ions in silicon dioxide at different electric field strengths.

FIG. 2 illustrates a plot of electric field versus the drift velocity of calcium (Ca) and magnesium (Mg) ions as compared to hydrogen ions in a silicon dioxide dielectric material. This plot was generated from the equation:

$$v_D \approx \upsilon d \exp\left[-\frac{E_a}{k_B T}\right] \sinh\left[\frac{|z|qdE}{2k_B T}\right] \quad (2)$$

In equation (2), ν is the attempt frequency, d is the jump distance, $E_a$ is the potential barrier, $k_B$ is the Boltzman Constant, T is the absolute temperature, z is the charge number of the ion, q is the elementary charge, and E is the electric field. Calcium has the following values: ν=2.97E+10 Hz, d=5.30E−10 m, $E_a$=1.121273 eV, $k_B$=1.38E−23 J K−1, T=300K, q=1.60E−19 C, z=2 ionic charge. Magnesium has substantially the same values as calcium except ν=1.04E+11 Hz and $E_a$=1.060351 eV. Hydrogen has substantially the same values as calcium and magnesium except ν=1.04E+11 Hz, $E_a$=0.8 eV, and z=1 ionic charge. These values were plotted in FIG. 2 to illustrate the mobility of both calcium and magnesium at various electric field strengths.

FIG. 2 shows that calcium and magnesium ions have six orders of magnitude better data retention than hydrogen. Additionally, hydrogen is well know for being very reactive and could get caught at the interface of the semiconductor/dielectric if it binds to a paramagnetic dangling bond. The calcium and magnesium ions are used for purposes of illustration only as alternate embodiments can use other ions, e.g., those with an activation energy of diffusion greater than the activation of hydrogen in the dielectric material (e.g., about 0.5 eV in silicon dioxide).

In operation, a MOS memory device can be programmed by biasing the control gates of each MOSFET memory cell being programmed with a programming voltage (e.g., 4V). In one embodiment, this is a positive voltage. In order to read the programmed memory cell, a read voltage (e.g., <1V) is applied to the control gate of the desired memory cell. The magnitude of the read voltage can be determined by the threshold voltage of the memory cell.

Unlike a flash memory cell, the MOSFET memory cell does not need to be erased prior to being reprogrammed. For example, in an MLC MOSFET memory cell that was programmed with certain threshold voltage by moving the charged species, reprogramming encompasses simply applying another either positive or negative voltage to the control gate. This moves the charged species to another location in the dielectric material, thus changing the flatband voltage (i.e., threshold voltage) of the device.

Figure 3:
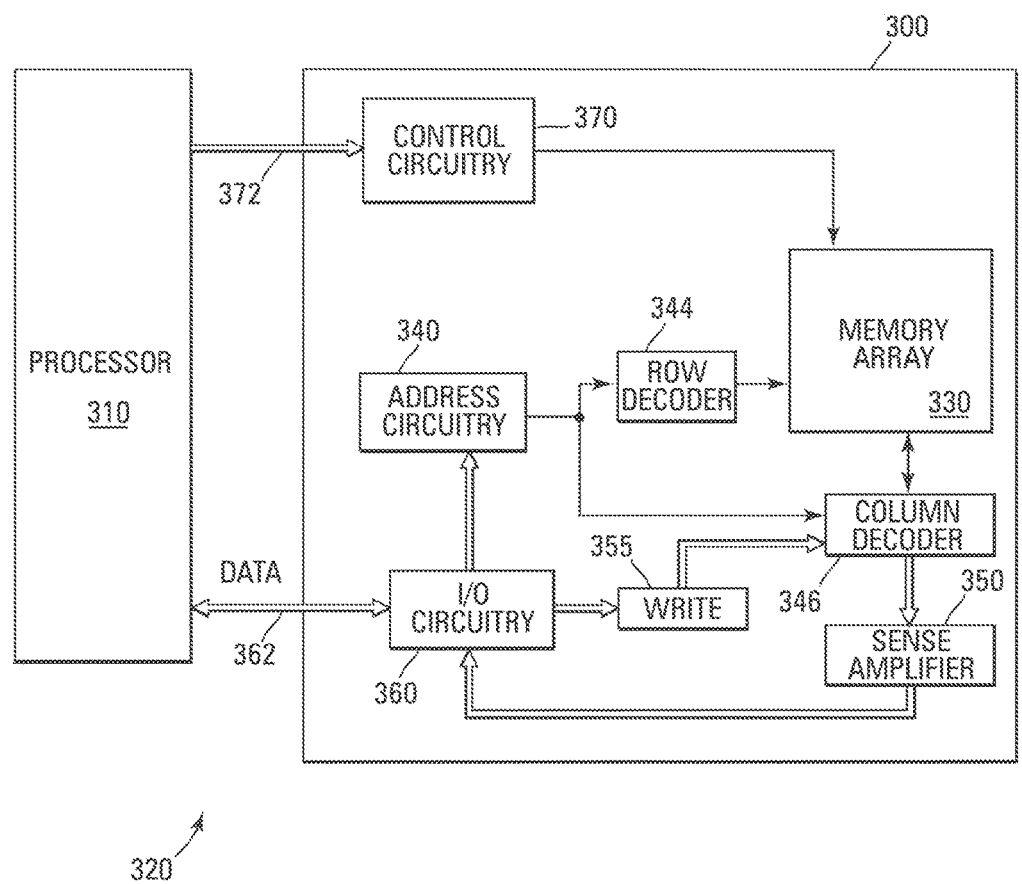
FIG. 3 shows a block diagram of one embodiment of a memory system that can incorporate the memory array with local sense circuits of the present embodiments.

FIG. 3 illustrates a functional block diagram of a memory device 300. The memory device 300 is coupled to an external processor 310. The processor 310 may be a microprocessor or some other type of controller. The memory device 300 and the processor 310 form part of a memory system 320. The memory device 300 has been simplified to focus on features of the memory that are helpful in understanding the present embodiments.

The memory device 300 includes an array 330 of MOSFET memory cells as described previously. The memory array 330 is arranged in banks of word line rows and bit line columns. In one embodiment, the columns of the memory array 330 comprise series strings of memory cells.

Address buffer circuitry 340 is provided to latch address signals provided through I/O circuitry 360. Address signals are received and decoded by a row decoder 344 and a column decoder 346 to access the memory array 330. It will be appreciated by those skilled in the art, with the benefit of the present description, that the number of address input connections depends on the density and architecture of the memory array 330. That is, the number of addresses increases with both increased memory cell counts and increased bank and block counts.

The memory device 300 reads data in the memory array 330 by sensing voltage or current changes in the memory array columns using sense amplifier circuitry 350. The sense amplifier circuitry 350, in one embodiment, is coupled to read and latch a row of data from the memory array 330. Data input and output buffer circuitry 360 is included for bidirectional data communication as well as the address communication over a plurality of data connections 362 with the controller 310. Write circuitry 355 is provided to write data to the memory array.

Memory control circuitry 370 decodes signals provided on control connections 372 from the processor 310. These signals are used to control the operations on the memory array 330, including data read, data write (program), and erase operations. The memory control circuitry 370 may be a state machine, a sequencer, or some other type of controller to generate the memory control signals. In one embodiment, the memory control circuitry 370 is configured to control voltages applied to control gates of the memory cells for reading and writing data to the memory cells.

The flash memory device illustrated in FIG. 3 has been simplified to facilitate a basic understanding of the features of the memory. A more detailed understanding of internal circuitry and functions of flash memories are known to those skilled in the art.

CONCLUSION

In summary, one or more embodiments of the flatband voltage adjustment in a MOS device can be accomplished by doping a dielectric material with a charged species that is mobile within the dielectric material. The charged species can then be moved in response to a voltage on a control gate of the device, thus adjusting the flatband voltage of the device. In one embodiment of a MOSFET, the flatband voltage is approximately equal to the threshold voltage of the device.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention.

What is claimed is:

1. A transistor, comprising:
a first source/drain region in a semiconductor;
a second source/drain region in the semiconductor;
a dielectric material adjacent to the semiconductor, the dielectric material containing non-hydrogenous ions; and
a control gate adjacent to the dielectric material;
wherein the non-hydrogenous ions have a drift velocity that is greater than six orders of magnitude less than a drift velocity of hydrogen ions when each of the drift velocities is determined in silicon dioxide at an applied electric field of 1000V/cm and at a temperature of 300K.

2. The transistor of claim 1, wherein the dielectric material is over the semiconductor and extending between the first source/drain region and the second source/drain region, and wherein the control gate is over the dielectric material.

3. The transistor of claim 1, wherein the non-hydrogenous ions have a drift velocity that is greater than six orders of magnitude less than a drift velocity of hydrogen ions and less than or equal to eight orders of magnitude less than the drift velocity of hydrogen ions when each of the drift velocities is determined in silicon dioxide at an applied electric field of 1000V/cm and at a temperature of 300K.

4. The transistor of claim 1, wherein the dielectric material has a dielectric constant greater than or equal to 3.9.

5. The transistor of claim 1, wherein the dielectric material comprises silicon dioxide.

6. The transistor of claim 1, wherein the non-hydrogenous ions are selected from a group consisting of calcium anions and magnesium anions.

7. A method for fabricating a transistor, the method comprising:
forming a dielectric material adjacent to a semiconductor;
introducing non-hydrogenous ions into the dielectric material; and
forming a control gate adjacent to the dielectric material;

wherein introducing the non-hydrogenous ions is performed prior to or during formation of the dielectric material.

8. A method for fabricating a transistor, the method comprising:
forming a dielectric material adjacent to a semiconductor;
introducing non-hydrogenous ions into the dielectric material; and
forming a control gate adjacent to the dielectric material;
wherein introducing the non-hydrogenous ions comprises immersing the semiconductor into an alkali solution.

9. The method of claim 8, wherein the semiconductor is immersed in a solution of one of $Ca(OH)_2$ or $MgCl_2$+Mg$(OH)_2$ dissolved in deionized water.

10. A method for fabricating a transistor, the method comprising:
forming a dielectric material adjacent to a semiconductor;
introducing non-hydrogenous ions into the dielectric material, wherein the non-hydrogenous ions have an ionic charge number greater than one; and
forming a control gate adjacent to the dielectric material;
wherein introducing the non-hydrogenous ions into the dielectric material comprises introducing non-hydrogenous ions having a drift velocity that is greater than six orders of magnitude less than a drift velocity of hydrogen ions when each of the drift velocities is determined in silicon dioxide at an applied electric field of 1000V/cm and at a temperature of 300K.

11. A method for fabricating a transistor, the method comprising:
forming a dielectric material adjacent to a semiconductor;
introducing non-hydrogenous ions into the dielectric material; and
forming a control gate adjacent to the dielectric material;
wherein introducing the non-hydrogenous ions is performed by contacting the dielectric material with an alkali solution.

12. The method of claim 7, wherein introducing the non-hydrogenous ions comprises introducing non-hydrogenous ions selected from a group consisting of cations and anions.

13. The method of claim 10, wherein introducing the non-hydrogenous ions into the dielectric material is performed after forming the dielectric material.

14. The method of claim 10, further comprising wherein the drift velocity of the non-hydrogenous ions is less than or equal to eight orders of magnitude less than the drift velocity of hydrogen ions when each of the drift velocities is determined in silicon dioxide at an applied electric field of 1000V/cm and at a temperature of 300K.

15. The method of claim 10, wherein introducing the non-hydrogenous ions into the dielectric material comprises introducing non-hydrogenous anions into the dielectric material.

16. The method of claim 10, wherein forming the dielectric material comprises forming a dielectric oxide.

17. The transistor of claim 1, wherein the transistor is a non-volatile memory cell of a memory device.

18. The transistor of claim 1, wherein each non-hydrogenous ion of the non-hydrogenous ions contained in the dielectric material has a drift velocity that is greater than six orders of magnitude less than a drift velocity of hydrogen ions when each of the drift velocities is determined in silicon dioxide at an applied electric field of 1000V/cm and at a temperature of 300K.

19. The method of claim 10, wherein introducing the non-hydrogenous ions into the dielectric material consists essentially of introducing non-hydrogenous ions having a drift velocity that is greater than six orders of magnitude less than a drift velocity of hydrogen ions when each of the drift velocities is determined in silicon dioxide at an applied electric field of 1000V/cm and at a temperature of 300K.

20. The method of claim 10, wherein introducing the non-hydrogenous ions into the dielectric material consists essentially of introducing non-hydrogenous ions having a drift velocity that is greater than six orders of magnitude less than a drift velocity of hydrogen ions and less than or equal to eight orders of magnitude less than the drift velocity of hydrogen ions when each of the drift velocities is determined in silicon dioxide at an applied electric field of 1000V/cm and at a temperature of 300K.

* * * * *